United States Patent [19]

Kaufman et al.

[11] Patent Number: 4,684,848
[45] Date of Patent: Aug. 4, 1987

[54] BROAD-BEAM ELECTRON SOURCE

[75] Inventors: Harold R. Kaufman; Raymond S. Robinson, both of Fort Collins, Colo.

[73] Assignee: Kaufman & Robinson, Inc., Fort Collins, Colo.

[21] Appl. No.: 787,665

[22] Filed: Oct. 15, 1985

Related U.S. Application Data

[63] Continuation of Ser. No. 535,730, Sep. 26, 1983, abandoned.

[51] Int. Cl.⁴ .................... H01J 7/24; H05B 31/26
[52] U.S. Cl. .................... 315/111.81; 315/111.21; 315/111.31; 315/111.91; 313/231.31; 313/362.1
[58] Field of Search .......... 315/111.21–111.91; 313/231.31, 231.41, 362.1

[56] References Cited

U.S. PATENT DOCUMENTS

| | | | |
|---|---|---|---|
| 3,311,772 | 3/1967 | Speiser et al. | 313/361.1 |
| 3,660,715 | 5/1972 | Post | 315/111.51 |
| 3,678,334 | 7/1972 | Dugdale et al. | 315/111.81 |
| 3,760,225 | 9/1973 | Ehlers et al. | 315/111.31 |
| 3,952,228 | 4/1976 | Reader et al. | 315/111.81 |
| 4,019,091 | 4/1977 | Schoenmakers | 315/111.81 |
| 4,388,560 | 6/1983 | Robinson et al. | 315/111.81 |
| 4,458,180 | 7/1984 | Sohval et al. | 313/231.41 |
| 4,516,050 | 5/1985 | Russo | 313/362.1 |

Primary Examiner—Saxfield Chatmon
Attorney, Agent, or Firm—Hugh H. Drake

[57] ABSTRACT

A broad-beam electron source has a chamber into which is introduced an ionizing gas. Electrons are emitted between a cathode and an anode assembly to ionize that gas. The electrons within the plasma are drawn outwardly from the chamber through an apertured wall, which constitutes a screen, and thereafter are accelerated toward a target in a well-directed beam. A comparatively copious supply of electrons is developed, while yet requiring only low voltages in connection with its generation and resulting in correspondingly low electron energies. Ions produced external to the electron source itself are utilized to assist in neutralizing the charge density of the electron beam in order to help maintain its definition. For insulative targets, secondarily emitted electrons permit conservation of surface charge.

23 Claims, 11 Drawing Figures

BROAD-BEAM ELECTRON SOURCE

This application is a continuation of U.S. application Ser. No. 535,730 filed Sept. 26, 1983 by the same inventorship and assigned to same assignee, now abandoned.

The present invention pertains to electron-beam sources. More specifically, it relates to broad-beam electron-beam sources that use a plasma as the source of electrons.

Single-aperture electron-beam sources have been used for many years. K. R. Spangenberg, *Vacuum Tubes*, McGraw-Hill Book Company, New York, pp. 412–474, 1948. They have been used in a variety of applications, such as cathode-ray tubes, electron-beam welders and, more recently, for photoresist exposure.

Although successfully used in these applications, single-aperture sources have been limited in electric current capacity by space-charge effects. Because of this limitation, the development of large electron currents has required large acceleration voltages, as exemplified in U.S. Pat. Nos. 3,749,967 and 4,061,944. In those approaches, the electron acceleration takes place within single-aperture optics. The existence of a plurality of apertures in one electrode are only for the evacuated region, after the electrons have been accelerated.

Larger electron currents may be obtained by the use of multiple-aperture optics, in which a number of small beamlets are accelerated in parallel. Although thermionic emitters are generally used for electron emission, it is difficult to use such emitters for multi-aperture acceleration, because of both the difficulty in balancing emission from parallel emitters and the high heating power normally associated with the simultaneous operation of many emitters.

For reliable and efficient operation of multi-aperture electron-beam sources, it is necessary to have many electron emission sources operating in parallel with uniform electron-emission characteristics. Although generally not recognized, as such, a plasma meets these requirements for electron emission. The generation and confinement of plasmas has reached a high level of efficiency. The technology of ion generation and confinement has been particularly developed in the field of broad-beam ion sources. H. R. Kaufman, "Technology of Electron-Bombardment Ion Thrusters", *Advances in Electronics and Electron Physics*, Vol. 36 [L. Marton,ed.], Academic Press, New York, pp. 265–373; H. R. Kaufman and R. S. Robinson, "Ion Source Design for Industrial Applications", AIAA Journal, Vol. 20, pp. 745–760, June 1982; and H. R. Kaufman, J. J. Cuomo, and J. M. E. Harper, "Technology and Applications of Broad-Beam Ion Sources Used in Sputtering. Part I. Ion Source Technology", J. Vac. Sci. and Technol., Vol. 21, pp. 725–736, September/October 1982.

There has been use of a plasma as an electron source in a single-grid ion source. J. M. E. Harper, M. Heiblum, and H. R. Kaufman, "Apparatus and Method for Neutralizing Ion Beams", U.S. patent application Ser. No. 355,067, filed Mar. 5, 1982. In this use, a multi-apertured single grid is used to accelerate a broad beam of ions. By proper selection of various operating potentials, it is possible to have electrons also escape from the discharge chamber. In escaping, they are then directed in a very approximate manner by the ion beam. There is no attempt to accelerate the electrons into a clearly directed beam.

Another use of a plasma as an electron source is described by A. Schauer, "Plasma lights up 14-in. Flat Panel Display", *Electronics*, Dec. 15, 1982, pp. 128–130. Here the electrons emerge in a plurality of separately-identifiable beams each individually controlled as to its intensity. To scan a raster, the beams are activated one row at a time.

Thus, at least somewhat broad electron beams have been produced with apparatus that requires very high voltages. On the other hand, plasma devices have been capable of much lower-voltage operation, but they have been either of a single aperture type or have used multiple physical apertures to produce a plurality of independently-controlled narrow beams. In sum, such prior art fails to achieve well-directed broad, high-current electron beams with low electron energy as would be desired in various applications to reduce undesirable effects such as physical damage, excessive penetration, X-Ray generation and heating.

It is a general object of the present invention to provide a broad-beam electron source which overcomes the deficiencies or limitations in prior apparatus of the kinds discussed above.

Another object of the present invention is to create what amounts to a plurality of electron sources that are inherently balanced in emission characteristics.

A further object of the present invention is to minimize heat losses in the beam-producing apparatus as well as in the workpiece upon which the beam impinges.

Still another object of the present invention is to provide what effectively is a plurality of parallel small electron beams all produced by comparatively low voltage and combined to develop a large total current.

A specific object of the present invention is to generate a broad electron beam which has a particularly selected profile.

Another specific object of the present invention is to produce a broad-beam of electrons which is of high current but of low electron energy.

As constructed in accordance with the embodiment of the present invention, an electron source has a chamber into which an ionizable gas is introduced. Disposed within the chamber are an anode and an electron-emissive cathode across which a potential is impressed to effect electron emission at a sufficient velocity to ionize the gas. Apertures in a bounding wall of the discharge chamber are used to extract electrons, but suppress ions. Those apertures are aligned with apertures in other electrodes, with the assembly of multi-apertured electrodes constituting an accelerating system of electron optics. The system is capable of accelerating multiple beamlets of electrons with the total current of electrons capable of exceeding the electron current that can be drawn from electron optics employing only a single aperture in each electrode.

Applications of the present invention include heating, annealing, welding and electron activated chemical reactions such as etching, deposition, lasing and photoresist exposure.

Because of the drawing of the electrons from a single, homogeneous plasma, the multiple beamlets are inherently balanced in electron-emission characteristics. The low voltage required enables low heat losses to be obtained. In addition, the apertures may be patterned to select the intensity profile across the beam.

The features of the present invention which are believed to be patentable are set forth with particularity in the appended claims. The organization and manner of operation of the invention, together with further objects and advantages thereof, may best be understood by reference to the following description taken in connection with the accompanying drawings, in the several figures of which like reference numerals identify like elements and in which:

Figure 1:
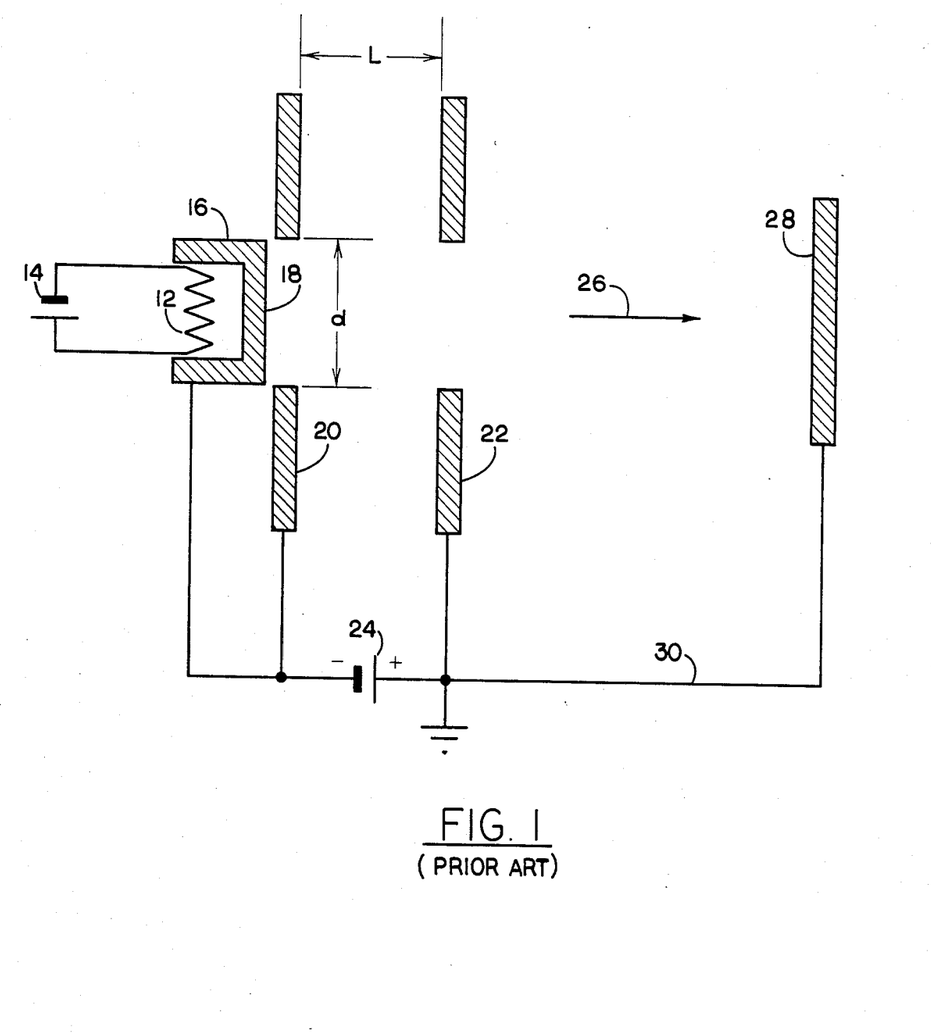
FIG. 1 is a schematic diagram of a known electron-beam source, together with its associated circuitry.

FIG. 1 enables an explanation of the nature and operation of a single-aperture electron-beam source. The actual physical structure of the apparatus may, of course, vary. A heating element 12 is energized by a power source 14, thereby heating an emitter 16 and more particularly an electron emitting surface 18, to electron emission temperature. A surrounding screen electrode 20 is electrically connected to emitter 16. An accelerator electrode 22 is maintained at a positive potential relative to electron emitter 16 and screen 20 by a power source 24. The aperture in accelerator electrode 22 is aligned with electron emissive surface 18 and the aperture in screen electrode 20, so that the accelerated electrons do not strike accelerator electrode 22 but continue on a path indicated by arrow 26. To assure that the electrons maintain their energy after leaving accelerator electrode 22, it is connected to system ground. When the electrons strike a target 28, in this case a conductor, a return path to ground is provided by a connection 30.

Figure 2:
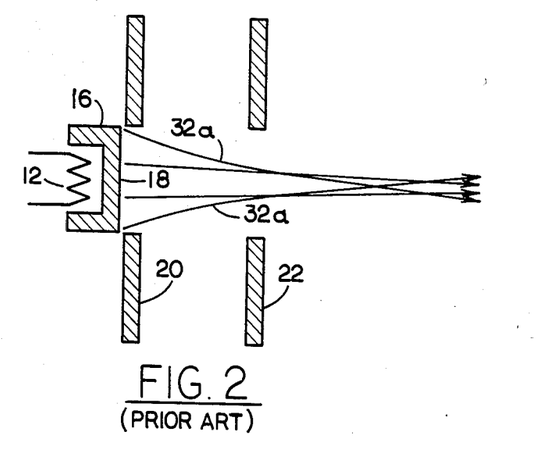
FIG. 2 is a fragmentary schematic diagram, similar to that in FIG. 1, but including representations of electron trajectories at low perveance.
Figure 3:
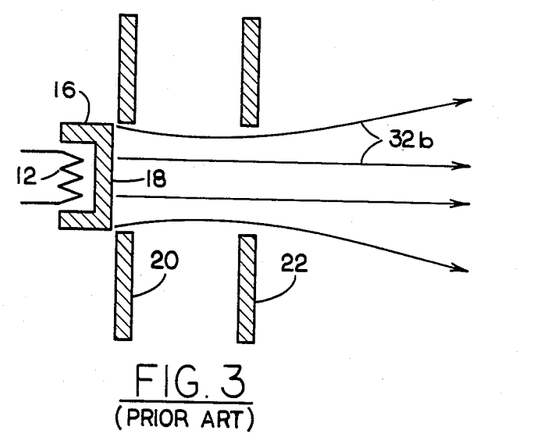
FIG. 3 is a fragmentary schematic diagram, similar to that in FIG. 1, but including representations of electron trajectories at high perveance.
Figure 4:
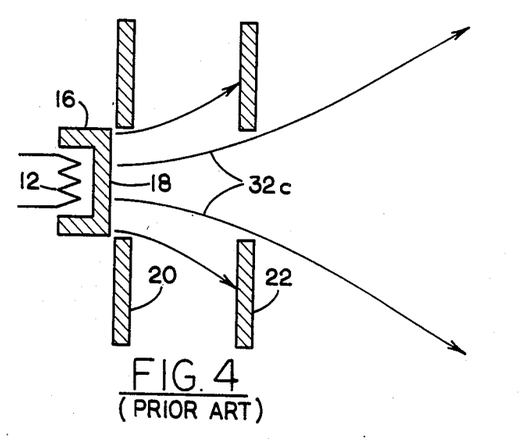
FIG. 4 is a fragmentary schematic diagram, similar to that in FIG. 1, but including representations of electron trajectories at excessive perveance.

Possible trajectories of the accelerated electrons are indicated in FIGS. 2–4. FIG. 2 indicates the trajectories that would be obtained at low perveance. Perveance is expressed by the relationship $J/V^{3/2}$, where J is the current of the accelerated electrons and V is the voltage of power source 24 (see FIG. 1). Because the electron trajectories are determined by the combined effects of electron current and acceleration voltage, it is preferable to refer to the perveance $J/V^{3/2}$ instead of either the current J or the voltage V alone. As indicated in FIG. 2, the electron trajectories 32a at low perveance tend to pass through the central portion of the aperture in accelerator electrode 22, thereby avoiding collisions with that electrode by large margins.

FIG. 3 indicates the trajectories that would be obtained at high perveance. In this case, the mutual repulsion of accelerated electrons results in the trajectories 32b being more divergent and filling the aperture in accelerator electrode 22. Because the electron trajectories 32b still do not strike that electrode, operation is satisfactory. Since the trajectories 32b will diverge increasingly with increasing perveance, the perveance represented in FIG. 3 is the maximum for which substantially all accelerated electrons will pass through the aperture in accelerator electrode 22.

FIG. 4 indicates trajectories 32c that would be obtained at a still higher, or excessive, perveance. The electrons that strike accelerator electrode 22 are lost and do not appear in the electron beam produced by the source. In addition, the electrons striking the electrode 22 can result in undesirable and damaging heating of the electrode.

For practical purposes, the maximum perveance for a single-aperture electron-beam source corresponds to the trajectories shown in FIG. 3. The maximum perveance for FIG. 3 can be approximated from Child's Law. For electrons, Child's Law gives the maximum current density between two parallel planes (in S. I. units) as $$j = 2.334 \times 10^{-6} V^{3/2}/x^2, \tag{1}$$

where V and x are the potential difference and the spacing between the planes. Approximating the distance x between the parallel planes with the distance L between electrodes 20 and 22 as shown in FIG. 1, the electron-beam current, J, can be obtained by multiplying the current density, j, of Equation 1, by the hole area $\pi d^2/4$, where d is the hole diameter as shown in FIG. 1. With these substitutions, Equation (1) can be rewritten as $$J/V^{3/2} = 1.83 \times 10^{-6} (d/L)^2. \tag{2}$$

Note that Equation (1) was also divided by $V^{3/2}$, so that the left side of Equation (2) is expressed in perveance. Perveance might be expected to increase indefinitely as d/L is increased. In practice, as d increases above about twice the value of L, the potential at the center of an aperture is no longer controlled sufficiently to be approximated with a planar equation such as Child's Law. A detailed discussion of the ratio d/L, or L/d, can be found in the above-identified article in the AIAA Journal. The maximum possible perveance thus, corresponds roughly to:

$$(J/V^{3/2})_{max} \sim 10^{-5}, \text{ where} \tag{3}$$

$$d/L \sim 2. \tag{4}$$

The maximum electron current that can be obtained from a single-aperture electron-beam source is, therefore, limited. For example, with a potential difference V between electrodes of 100 V, the maximum electron current that can be extracted is about 10 milliamperes. Note that this current level is independent of the physical size of the single aperture.

The perveance limitation described above for single-aperture electron optics is a fundamental restriction. If increased perveance is desired, above the value given by equation (3), it is necessary to use multi-aperture electron optics. In more physical terms, the current capacity of a source using single-aperture electron optics is severely limited at low voltages.

Figure 5:
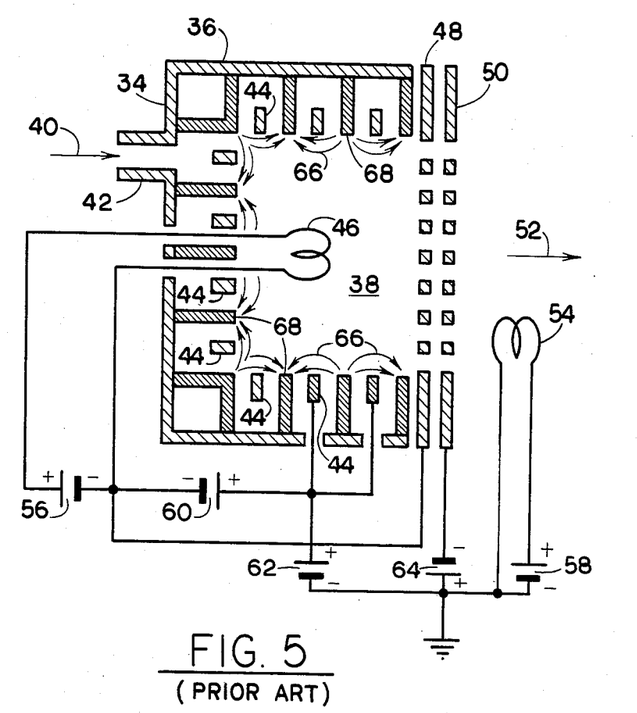
FIG. 5 is a schematic diagram of a known ion-beam source, together with its associated circuitry.

FIG. 5 illustrates the nature and operation of an electron-bombardment ion source of a multi-pole type. The actual physical structure of the apparatus may, of course, vary, but a suitable and workable example of physical implementation is described in the aforementioned AIAA Journal along with the above-identified article from J. Vac. Sci. and Technol. A housing 34 is in the form of a cylindrical metallic shell 36 that circumscribes and defines a chamber 38 in which an ionizable gas, such as argon, is to be contained. As indicated by the arrow 40, the gas is introduced into one end of shell 36 through manifold 42. Disposed within shell 36 are anodes 44. More or less centrally positioned within chamber 38 is cathode 46.

In the vicinity of the end of shell 36, opposite that which, in this case, manifold 42 is located, is an apertured screen grid 48. Spaced beyond screen grid 48 is an apertured accelerator grid 50. The apertures in screen grid 48 are aligned with the apertures in accelerator grid 50, so that the solid portions of accelerator grid 50 are shielded from bombardment by ions withdrawn from chamber 38 through screen grid 48. From accelerator grid 50, the ions proceed along a path indicated by arrow 52. Situated beyond accelerator grid 50 from chamber 38 is a neutralization cathode 54.

As therein incorporated, cathodes 46 and 54 are each formed of a refractory metal filament such as tantalum or tungsten wire. The opposite ends of the cathodes are individually connected across respective energizing sources 56 and 58. Sources 56 and 58 may deliver either direct or alternating current. Other types of cathodes, such as a hollow cathode which, during normal operation, may require no heating current, may be substituted.

For creating and sustaining electron emission from cathode 46, a direct-current source 60 has its negative terminal connected to cathode 46 and its positive terminal connected to anodes 44. Connected with its positive terminal to anodes 44 and its negative terminal connected to system ground, as indicated, is a main power source 62 of direct current. Another direct-current source 64 has its negative terminal connected to accelerator grid 50 and its positive terminal returned to system ground. Finally, one side of neutralizing cathode 54 is also returned to ground. For an alternating current energizing source, the center tap of the energizing transformer winding can be returned to system ground. Completing the power-source energizing arrangements, screen grid 48 is in this case connected to one side of cathode 46.

To increase the probability of electrons emitted from cathode 46 having ionizing collisions before reaching anodes 44, magnetic-field lines 66 are generated between adjacent permeable pole pieces 68. The means for magnetically energizing permeable pole pieces 68 are not shown, but may be either electomagnets or permanent magnets. In FIG. 5, as well as in others of the figures, it is to be understood that all portions of a given element are electrically interconnected although that is not always shown. Thus, all segments of the anode are maintained at the same potential.

Figure 6:
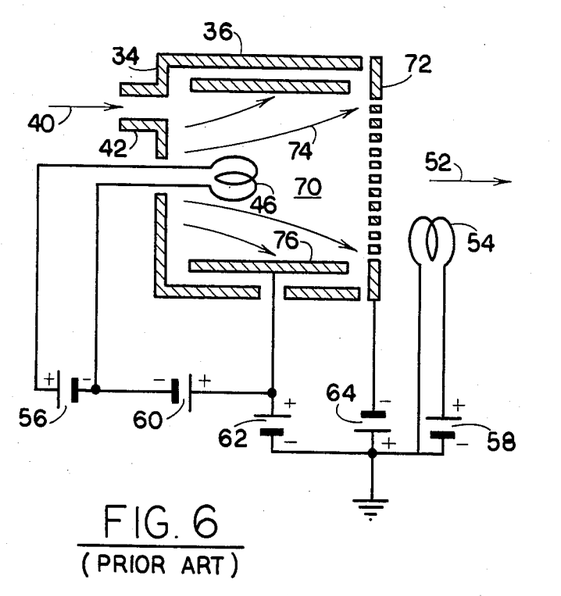
FIG. 6 is a schematic diagram of another known ion-beam source, together with its associated circuitry.

Turning next to FIG. 6, it illustrates an electron-bombardment ion source which employs a divergent-field discharge chamber and a single, multi-apertured accelerator grid 72. Overall, the operation of the system of FIG. 6 is similar to that already described with respect to the multipole ion source of FIG. 5. There are significant differences, however. First, the strength of the magnetic-field indicated by line 74 is significant over most of the volume defined by chamber 70 in FIG. 6, while in FIG. 5 the magnetic-field strength is significant only near the anodes 44 and the pole pieces 68. Second, there is no screen grid in FIG. 6, so that ions extracted from chamber 70 will also strike accelerator grid 72, in addition to passing through the apertures of that accelerator grid. In this case, an anode 76 is in the form of a single shell. Otherwise, power sources and connections are the same as in FIG. 5.

The advantage of the system shown in FIG. 6 over the system shown in FIG. 5 is that the single accelerator grid does not depend on the maintenance of a close mechanical spacing between a screen grid and an accelerator grid to obtain a high ion current density. Instead, with a single grid, the acceleration distance is the thickness of the plasma sheath adjacent to accelerator grid 72. As described in the aforementioned article in J. Vac. Sci. and Technol., this absence of a mechanical limit permits higher ion current densities at low voltages than would be possible with two-grid optics.

There is an alternative mode of operation for the system shown in FIG. 6 that is significant, as described in the last-mentioned article and in the above-referenced patent application. To obtain this mode, the voltage of power source 64 is reduced to, or near, zero. The voltage of power source 62 is then reduced to be approximately equal to the voltage of power source 60. A substantial ion current density (approximately 1 $mA/cm^2$) can still be extracted at this low voltage applied by power source 62. As explained in the references, energetic electrons can also escape from chamber 70 and be used to neutralize the escaping ions. While the primary function of accelerator grid 72 is still to accelerate ions in this mode, the simultaneous escape of the electrons is an auxiliary function that permits neutralizer cathode 54 and power source 58 to be eliminated. However, the electrons are not accelerated to form a directed beam of electrons. Instead, their motion is randomized and fills the entire volume of the accelerated ion beam for purposes of neutralization only.

Figure 7:
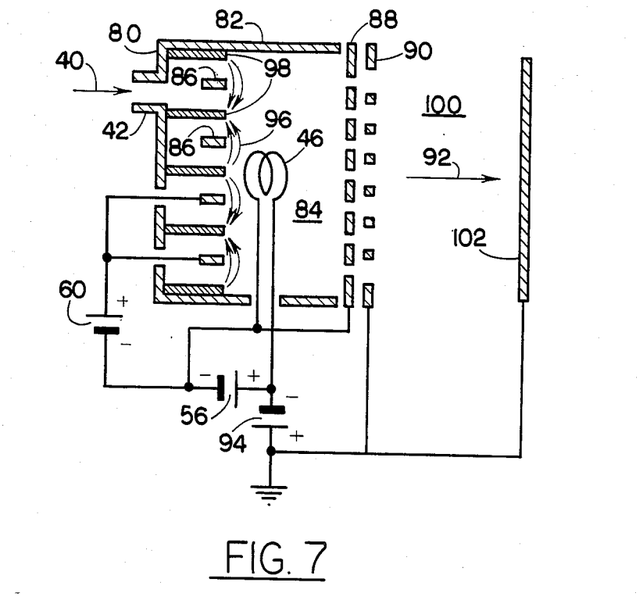
FIG. 7 is a schematic diagram of an electron-beam source constructed in accordance with one embodiment of the present invention.
Figure 8:
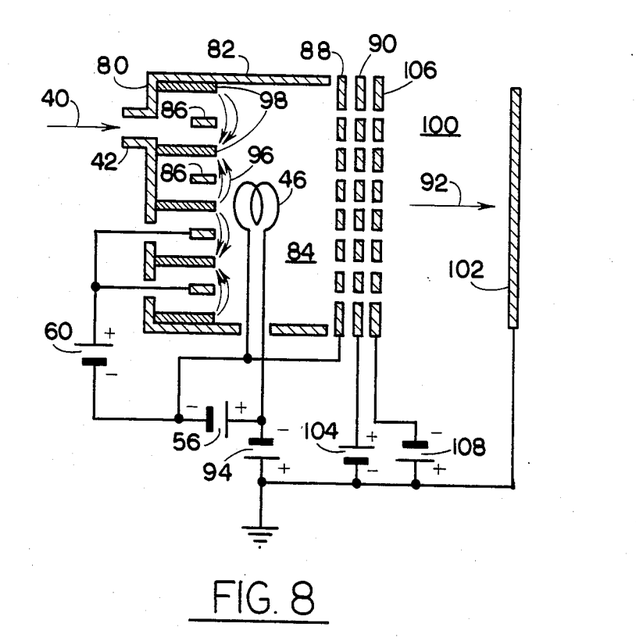
FIG. 8 is a schematic diagram of an electron-beam source similar to that shown in FIG. 7, but with an alternate embodiment of electrodes to accelerate the electrons.

To make use of the electrons in the plasma as a defined broad beam and not just as a random ion neutralizer, an approach exemplified by FIGS. 7 and 8 is used. In both of those approaches, an ionizable gas is introduced along a path 40 through manifold 42, and there again are a cathode 46 and power sources 56 and 60 which serve the same purpose as in FIG. 5. In this case, cathode 46 is shown as mounted from a different location.

Housing 80 again is in the form of a cylindrical metallic shell 82 that circumscribes and defines a chamber 84 in which an ionizable gas, such as argon, is to be contained. Spaced within shell 82 are anodes 86. In the vicinity of the end of shell 82, opposite that which, in this case, manifold 42 is located, is an apertured screen grid 88. Spaced beyond screen grid 88 is an apertured accelerator grid 90. The apertures in screen grid 88 are aligned with the apertures in accelerator grid 90 so that the solid portions of accelerator grid 90 are shielded from bombardment by electrons withdrawn from chamber 84 through screen grid 88. Thus, the electrons proceed along an electron-beam path indicated by arrow 92. Moreover, the potentials applied individually to the different elements can be adjusted, so that grid 88 acts as a selective getter. That is, the relative potentials enable the achievement of desired collimation or current control through variation in the established electro-optical lens.

As herein incorporated, cathode 46 again is formed of a refractory filament such as tantalum or tungsten wire. The opposite ends of the cathode 46 are connected across energizing source 56 and that source may deliver either direct or alternating current. As before, other types of cathodes, such as a hollow cathode which, during normal operation, may require no heating current, may be substituted. For creating and sustaining electron emission from cathode 46, direct current source 60 has its negative terminal connected to cathode 84 and its positive terminal connected to anodes 86. Accelerator grid 90 is also connected to system ground. Another power source 94 has its positive terminal connected to system ground and its negative terminal connected to cathode 46.

Once more to increase the probability of electrons emitted from cathode 46 having ionizing collisions before reaching anodes 86, magnetic-field lines 96 are generated between permeable pole pieces 98. The means of magnetically energizing the permeable pole pieces 98 again are not shown, but may be either electromagnets or permanent magnets.

The electron population within the chamber 84 consists of both high-energy electrons emitted by cathode 46 and low-energy randomized, or Maxwellian, electrons, which are both electrons from cathode 46 that have undergone many collisions and electrons resulting from the ionization of neutral gas atoms. The electrons which are extracted to form the electron beam consist, at least in part, of the high-energy electrons. Depending on the size of the apertures in screen grid 88 and the accelerator grid 90, the thicknesses of the grids, the spacing between the grids and the potential difference between the grids, low-energy Maxwellian electrons will also be extracted.

During the acceleration of the electrons and their passage through a region 100 to a target 102, it is important that the electrons not be deflected excessively. Target 102 is in this case conductive and connected to system ground. The deflection depends on the integral of the transverse magnetic field that must be crossed, as described in the aforementioned AIAA Journal. For an initially stationary electron, the magnetic field integral that can be crossed by an electron is:

$$\int B dx = 3.37 \times 10^{-6} V^{\frac{1}{2}}, \quad (5)$$

where V is the accelerating potential difference, B is field strength and x is the spacing between the planes. For the deflection of an electron to be small for an accelerating potential difference of V, the magnetic integral crossed should be small compared to the value given by Equation (5). To this end, the discharge chamber shown in FIG. 7 is a multipole type with pole pieces 98 removed from screen grid 88 and accelerator grid 90.

In region 100 between accelerator grid 90 and target 102, it is useful also to have positive ions present, thereby avoiding or dispelling the disruptive effects of mutual repulsion between electrons which may otherwise prevail, depending on the beam current, electron energy, distance to the target, and other operating parameters. The gradual ionizaton of neutral gas atoms in region 100 provides these positive ions. At a pressure of $10^{-4}$ Torr (about $1.3 \times 10^{-2}$ Pascals), for example, a 50 eV electron has an ionizing path length in argon of about 10 m. The corresponding ion production rate neutralizes a 50 eV electron beam in about 0.2 microseconds. Thus, a pressure sufficient to permit rapid charge neutralization of the electron beam will, at the same time, have little effect on the propagation of the beam for several meters.

Another consideration in the embodiment of FIG. 7 is the selection of aperture size and the number of apertures in screen grid 88. In a broad-beam ion source, it is generally desirable to extract as many ions as possible, which means reducing the solid area of the screen grid 48 in FIG. 5, for example, to as small an amount as possible. However, the much greater mobility of the electrons makes such a large open area unnecessary in FIG. 7.

The relative arrival rates of the electrons and ions can be approximated. The electron velocities tend to be randomized in both magnitude and direction. The arrival rate per unit area of a randomized electron distribution of temperature $T_e$ at a plasma boundary is $$\dot{n}_e = n_e (kT_e/2\pi m_e)^{\frac{1}{2}}, \quad (6)$$

where $n_e$ is the electron density, k is the Boltzmann constant, and $m_e$ is the electron mass.

The ion random energy is quite small compared to the electron random energy, and can generally be ignored. As explained in the aforementioned Academic Press and AIAA Journal articles, the ion directed energy near the plasma boundaries is substantial, resulting in an ion arrival rate of $$\dot{n}_i = n_i (kT_e/m_i)^{\frac{1}{2}}, \quad (7)$$

where $n_i$ and $m_i$ are the ion density and mass. Because the electron and ion densities are essentially equal in a plasma, the ratio of the two arrival rates is $$\dot{n}_e / \dot{n}_i = (m_i / 2\pi m_e)^{\frac{1}{2}}. \quad (8)$$

This result assumes only a Maxwellian electron distribution. The actual electron distribution usually includes a nearly monoenergetic high-energy component. The ratio of electron and ion arrival rates should therefore be considered only approximate and of the form $$\dot{n}_e / \dot{n}_i \sim (m_i / m_e)^{\frac{1}{2}}. \quad (9)$$

Compared to ion extraction in ion sources, then, small apertures permit large electron currents to be extracted from electron sources.

A related consideration in the selection of aperture open area is that of possible disturbance to the plasma. The plasma serves to distribute electrons to the apertures, and if this distribution approaches the emission rate of cathode 46, it will be difficult to maintain the operation of the discharge. This condition will depend on a variety of dimensions, so that it cannot be expressed in terms of the screen-grid to open-area ratio alone.

There is, therefore, a general need to limit the open area fraction of a screen grid in an electron source, whether for extraction uniformity or for discharge stability. Compared to the open area permissible in an ion source, this open area fraction is smaller.

The discharge chamber can be readily constructed physically in the same manner explained for ion-beam sources in the above-mentioned articles in Academic Press, the AIAA Journal and J. Vac. Sci. and Technol. In this case, typical operating parameters are:
Discharge-chamber diameter, 10 cm;
Discharge-chamber depth, 5 cm;
Discharge-chamber pressure, $5 \times 10^{-4}$ Torr (argon);
Magnetic integral at anodes, $7 \times 10^{-5}$ Tesla-M; and
Discharge, 1A at 50 V.

For use as an electron-beam source, the magnetic integral through the acceleration region and the transit to the target should be small as discussed previously. A typical value for background pressure in the beam transit region is $10^{-4}$ Torr. For the apertures in screen grid 88, 25 holes, each 1 mm in diameter, permit an electron beam current of 100 mA to be extracted. For a spacing between grids of 1 mm, a 200 V potential difference is adequate to extract this 100 mA current. With chamber dimensions typically of multiple-centimeter size, as described earlier, it will be observed that the size of the plasma region is large compared to the Debye length in the plasma.

Screen grid 88 and accelerator grid 90 are assumed to be parallel, with their respective apertures aligned as in the preceding discussion. Other optics arrangements have been used for ion sources, as mentioned in the aforesaid AIAA Journal article, and can be adapted to electron sources. For example, spherically dished grids with apertures aligned along radii can be used to generate diverging or converging electron beams. Or, alternatively, displaced apertures in one grid, relative to the apertures in the other grid, can be used to accomplish similar effects with planar grids.

One alternate embodiment of the present invention is shown in FIG. 8. The operation is generally similar to the operation of the system of FIG. 7. The significant difference resides in the electron optics. Following screen grid 88, accelerator grid 90 is connected to the positive terminal of an energizing power source 104 and the negative terminal of that source is connected to the system ground. Spaced beyond grid 90 is a decelerator grid 106 which is connected to the negative terminal of an energizing power source 108, and the positive terminal of source 108 is connected to the system ground. The apertures in accelerator grid 90 and decelerator grid 106 are aligned with the apertures in screen grid 88.

Because accelerator grid 90 is positive of system ground, it tends to collect electrons from the background plasma generated in region 100 and the connected volume surrounding the electron source. This collection, if not impeded, would result in the potential of region 100 being raised to approximately the potential of accelerator grid 90. To prevent such electron collection, decelerator grid 106 is operated at a potential negative of system ground. Decelerator grid 106 prevents such electron collection by shielding accelerator grid 90 from the plasma in region 100. At the same time, positive ions, that are attracted by negative decelerator grid 106, are repelled by positive accelerator grid 90 and thereby are prevented from penetrating further into the source and causing sputtering damage of negative electrodes such as screen grid 88.

The electron energy in the beam transit region 100 is determined primarily by the potential of power source 94. In the system of FIG. 7, the extraction potential difference is determined by the potential of this same power source. In the system of FIG. 8, the extraction potential difference is the sum of the potentials of power sources 94 and 104. For the same energy in the transit region 100, then, the system of FIG. 8 permits a greater extraction voltage to be used. From Equation (3), it will be seen that a greater extraction voltage permits a greater electron current to be extracted from each aperture in screen grid 88. For a given electron-beam energy, then, the system of FIG. 8 is better suited to the extraction of higher electron-beam currents.

Figure 9A:
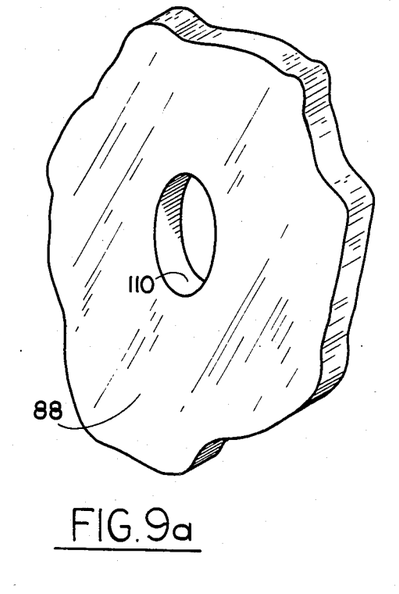
FIG. 9a is a fragmentary diagram of a portion of a screen grid as used in FIG. 7.
Figure 9B:
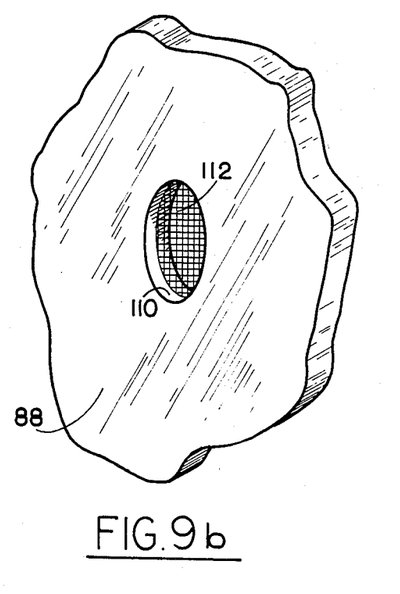
FIG. 9b is a similar view of an alternate construction of that screen grid.

Another alternate to the embodiment of FIGS. 7 and 8 is shown in FIG. 9b. FIG. 9a illustrates a portion of screen grid 88 depicting one aperture 110. Because of thermal expansion and machining tolerances, it is customary to use aperture sizes of the order of 1 mm. The Debye shielding distance, discussed in the aforesaid Academic Press article, is of the order of 0.1 mm in most discharge chambers of the type under consideration. This means that the potential at the center of an aperture can be considerably different from the potential on the metallic or otherwise conductive portions of screen grid 88. As a result, both high-energy and Maxwellian electrons can easily be extracted. The energy of the beam electrons will, therefore, have a spread equal (in eV) to about the potential (in V) of power source 60 in FIGS. 7 and 8.

When a smaller energy spread is desired in the extracted electron beam, the low-energy Maxwellian electrons can be prevented from escaping by using a fine-mesh 112 to cover the apertures in screen grid 88 as shown in FIG. 9b. The openings in mesh 112 approximate the Debye shielding distance, so that the potential throughout aperture 110 can be made to approximate the potential of screen grid 88. As pointed out in the Academic Press article, the plasma in the discharge is at roughly the potential of anode 86. Thus, the low-energy Maxwellian electrons will have insufficient energy to escape through mesh 112. Because only a fraction of the electrons will be permitted to escape through mesh 112, the open area of the apertures in the screen grid can be increased over that without mesh 112.

Figure 10:
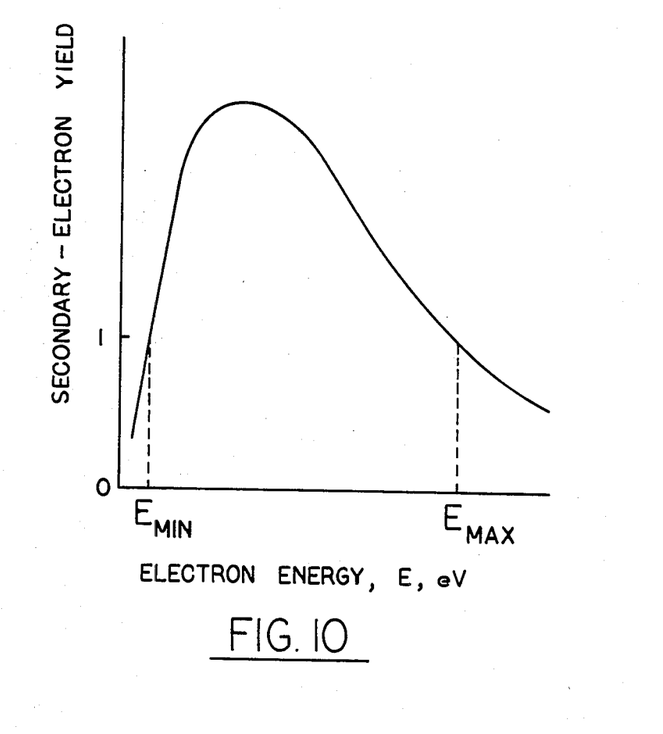
FIG. 10 is a graph that illustrates the variation in secondary electron yield from a solid surface as a function of incident electron energy.

Yet another manner of operation of the present invention can be explained with the aid of FIG. 10. In both FIG. 7 and FIG. 8, the target of the ion beam was explicitly or implicitly assumed to be a conductor. The bombardment of an insulative target may also be achieved. The embodiments of either FIGS. 7 or 8 may be operated in this manner, so as to cause electron bombardment of an insulative substrate or surface. Thus, the broad beam of electrons generated can be utilized to bombard either an insulative or a non-insulative target. With a non-conductive target, the surface charge on the target may be conserved with low energy ions generated by the electrons directed to the target.

When a surface is bombarded by an incident electron, low energy (several eV) secondary electrons may be emitted. The general variation of secondary-electron emission with incident-electron energy is indicated in FIG. 10. For materials that have maximum secondary-electron yields exceeding unity, which includes many materials, there is exhibited a minimum energy, $E_{min}$, at which the secondary yield is unity and a maximum energy, $E_{max}$, at which the yield again is unity. The minimum energy ranges from about 10 to 200 eV, while the maximum energy is typically 500 eV, or higher. Between these two electron energies, an electron beam can be used to bombard an insulator with only a moderate (several volts) potential buildup on the surface. This is because small electric fields at the surface will be sufficient to prevent the excess of secondaries (above unity yield) from escaping the surface, thereby maintaining conservation of surface charge.

It will have become apparent that applicants have taken advantage of methods and apparatus previously disclosed and well known for the purpose of developing ion beams to produce, instead, a copious source of electrons. In the earlier ion-beam apparatus, the electrons often were a problem and, indeed, various schemes were employed in order to suppress adverse effects arising from the existence of the electrons. The only constructive use of electrons was to neutalize the ions. Now, what may be quite similar apparatus is used instead to generate a broad electron beam which not only has no problem with also developed ions but also even uses ions which are present to increase the stability and definition of the electron beam. Furthermore, the same plasma also may serve as a source of ions to be utilized either separately or in combination with the electron beam and also directed toward the same or a different target.

Thus, the broad objectives of obtaining a wide electron beam of low energy has been achieved in a manner which, in some respects, has previously been used only for the almost opposite purpose of obtaining an ion beam rather than any electrons. At the same time, the electron beam obtained is procured in such a way as to avoid the adverse effects mentioned in the introduction with regard to such difficulties as unbalanced electron-emission characteristics, undue heat losses and the like.

It will be noted that the plasma serves as an extended electron source as compared with the use of single-aperture optics. As illustrated, the screen grids each are composed of an array of physically-defined apertures. That is not a structural limitation upon implementation of the overall principle. For example, a single, long slit can effectively replace a series of circular apertures. With a ratio L/d (FIG. 1) of one hundred, the slit becomes the equivalent of approximately one-hundred apertures.

It is further to be noted that the approaches specifically described assume a uniform aperture distribution among the different grids. With the present approach, that is not a necessary limitation. Indeed, the aperture pattern may be varied as might be desired for any given application in order to vary the pattern of bombardment by the developed electrons.

While particular embodiments of the invention have been shown and described and various alternatives have been suggested, it will be obvious to those of ordinary skill in the art that changes and modifications may be made without departing from the invention in its broader aspects. Therefore, the aim in the appended claims is to cover all such changes and modifications as fall within the true spirit and scope of that which is patentable.

We claim:

1. An electron source comprising:
   a chamber;
   means for introducing an ionizable gas into said chamber;
   means for developing a plasma throughout a region within said chamber and the size of which region is large compared to the Debye length in said plasma;
   and a selective means constituting a bounding wall of said chamber effectively defining a screen with an array of apertures transmissive of electrons produced from said plasma together with means, including the impressing of a potential on said screen, to enable broad extraction from said chamber of a defined broad beam of said produced electrons, while screening flow of ions from within said chamber, said selective means accelerating an effective plurality of electron beamlets which exhibit balanced electron-emlssive characteristics that coalesce into a defined beam.

2. An electron source as defined in claim 1 in which said developing means includes within said chamber an anode assembly and a cathode together with means for impressing a potential difference between said anode assembly and said cathode to effect emission of ionizing electrons from said cathode at a velocity sufficient to ionize said gas and thereby generate said plasma.

3. An electron source as defined in claim 1 in which said plasma is homogeneous throughout said chamber.

4. An electron source as defined in claim 1 in which said selective means includes an accelerating grid spaced beyond said screen from said chamber together with means for biasing said accelerating grid to cooperate with said screen and complete definition of said beam of produced electrons.

5. An electron source as defined in claim 1 in which said screen permits transmission through said apertures of sufficient positive ions from said plasma to inhibit mutual repulsion between electrons in said defined beam.

6. An electron source as defined in claim 1 in which the apertures in said screen effectively are sufficiently small to discourage the flow therethrough of positive ions from said plasma, while yet being sufficiently large to permit copious transmission therethrough of said produced electrons.

7. An electron source as defined in claim 1 in which the open area fraction in said screen is sufficiently small to maintain stability of emission from said cathode, while insuring uniformity of emission through said apertures.

8. An electron source as defined in claim 4 in which the acceleration of the produced electrons is subjected to a magnetic field, but the magnetic field integral crossed by the trajectories of said electrons is sufficiently small to inhabit any substantial deflection of produced electrons transmitted from said apertures.

9. An electron source as defined in claim 4 in which a decelerating grid is spaced further beyond said accelerating grid from said chamber, in which said decelerating grid is biased to repel background electrons otherwise penetrating the space between said source and a target.

10. An electron source as defined in claim 9 in which said accelerating grid is biased and formed to repel background positive ions which tend to escape from space between said source and a target through apertures in said grids.

11. An electron source as defined in claim 1 in which a mesh is disposed over each of said apertures in said screen, said mesh having openings which at least approximate the Debye shielding distance in order to unify the potential across each aperture to that of said screen.

12. An electron source as defined in claim 1 wherein said source is combined into a system in which said produced electrons are directed to a target, and in which said target is conductive and connected to a neutral potential level within said source.

13. An electron source as defined in claim 1 wherein said source is combined into a system in which said produced electrons are directed to a target, and in which said target is non-conductive but secondarily electron emissive to a degree sufficient to prevent excess electron accumulation on said target, so as to conserve surface charge.

14. An electron source as defined in claim 1 wherein said source is combined in a system in which said produced electrons are directed to a target, and in which said target is non-conductive but the surface charge on the target is conserved with low energy ions generated by said electrons directed to said target.

15. An electron source as defined in claim 1 in which the diameter of the apertures in said screen have a size which is less than approximately that of the Debye distance, thereby tending to exclude low-energy electrons from said defined beam and reducing energy spread in said beam.

16. An electron source as defined in claim 2 in which the potential on said screen, relative to said cathode, is adjustable to enhance collimation of said electrons or enable control of the level of electron current produced.

17. A method of developing a broad beam of electrons which comprises:
introducing an ionizable gas within a confined space;
creating ionization of said gas to produce a plasma that yields a copious supply of electrons along with positive ions, said plasma being created throughout a region the size of which is large compared to the Debye length in said plasma;
and extracting said electrons from said plasma as an effective plurality of beamlets of uniform electron-emission characteristics and which together define a broad-area beam thereof and directing said beam toward a target.

18. The method as defined in claim 17 which includes the inhibiting of the extraction of said ions from said plasma.

19. The method as defined in claim 17 in which ions also are extracted from said plasma.

20. The method as defined in claim 17 in which the extraction of said ions from said plasma is inhibited beyond significant utility in controlling the definition of said beam.

21. The method as defined in claim 17 which includes accelerating said electrons extracted from said plasma and thereby completing definition of said beam.

22. The method as defined in claim 21 which further includes decelerating said electrons following said accelerating thereof.

23. The method of producing a broad beam of low-energy electrons that comprises the use of:
a chamber,
means for introducing an ionizable gas into said chamber;
an anode assembly disposed in said chamber;
a cathode disposed in said chamber;
means for impressing a potential difference between said anode assembly and said cathode to effect emission of ionizing electrons from said cathode at a velocity sufficient to ionize said gas and thereby generate a plasma throughout a region within said chamber and the size of which is large compared to the Debye length in said plasma;
and a selective means constituting a bounding wall of said chamber effectively defining a screen with an array of apertures;
the new use comprising:
sizing said apertures sufficiently small to avoid significant disturbance to said plasma and maintain the existence of said plasma, while extracting said electrons into a defined beam with said defined beam being in the form of an effective plurality of electron beamlets which exhibit balanced electron-emission characteristics that coalesce into said defined beam;
and permitting the transmission of electrons copiously through said screen, while reducing the flow of ions therethrough.

* * * * *